US007975938B2

(12) United States Patent
Erickson et al.

(10) Patent No.: US 7,975,938 B2
(45) Date of Patent: Jul. 12, 2011

(54) COATING SYSTEM

(75) Inventors: Stuart J. Erickson, Marblehead, MA (US); Drew D. Erickson, West Newbury, MA (US); Wesley O. Davis, Plaistow, NH (US); Christopher J. Cote, Amesbury, MA (US); Norman R. Faucher, Londonderry, NH (US)

(73) Assignee: Ultrasonic Systems, Inc., Haverhill, MA (US)

( * ) Notice: Subject to any disclaimer, the term of this patent is extended or adjusted under 35 U.S.C. 154(b) by 0 days.

(21) Appl. No.: 12/626,966

(22) Filed: Nov. 30, 2009

(65) Prior Publication Data

US 2010/0107972 A1 May 6, 2010

Related U.S. Application Data

(63) Continuation of application No. 11/331,412, filed on Jan. 11, 2006, now abandoned, and a continuation-in-part of application No. 10/927,547, filed on Aug. 26, 2004, now abandoned, which is a continuation-in-part of application No. PCT/US2004/009549, filed on Mar. 29, 2004.

(60) Provisional application No. 60/643,024, filed on Jan. 11, 2005, provisional application No. 60/458,487, filed on Mar. 28, 2003.

(51) Int. Cl.
*B05B 1/08* (2006.01)
*B05B 3/04* (2006.01)

(52) U.S. Cl. .................. 239/102.2; 239/102.1; 239/291; 239/292; 239/300; 118/313

(58) Field of Classification Search ............... 239/102.1, 239/102.2, 290, 292, 291; 118/300, 305, 118/323, 313
See application file for complete search history.

(56) References Cited

U.S. PATENT DOCUMENTS

| | | | | |
|---|---|---|---|---|
| 3,103,310 | A * | 9/1963 | Lang | 239/4 |
| 4,085,893 | A | 4/1978 | Durley, III | |
| 4,601,921 | A * | 7/1986 | Lee | 427/240 |
| 4,930,700 | A | 6/1990 | McKown | |
| 5,104,042 | A * | 4/1992 | McKown | 239/102.2 |
| 5,186,389 | A | 2/1993 | Shibano | |
| 5,409,163 | A | 4/1995 | Erickson et al. | |
| 5,540,384 | A | 7/1996 | Erickson et al. | |
| 5,582,348 | A | 12/1996 | Erickson et al. | |
| 5,622,752 | A | 4/1997 | Erickson et al. | |
| 6,478,754 | B1 * | 11/2002 | Babaev | 601/2 |
| 6,663,554 | B2 | 12/2003 | Babaev | |

OTHER PUBLICATIONS

International Preliminary Report on Patentability issued Oct. 13, 2005 in related PCT Application No. PCT/US2004/009549.

* cited by examiner

*Primary Examiner* — Dinh Q Nguyen
(74) *Attorney, Agent, or Firm* — Banner & Witcoff, Ltd.

(57) ABSTRACT

Disclosed is a coating system for the selective application of coatings to substrates to apply a uniform coating to selected areas of the substrate without the need for masking. The system comprises a first coating applicator for coating large areas of the substrate, a second coating applicator for coating small areas of the substrate, a motion and positioning system for both coating applicators and a system controller. Also disclosed is an ultrasonic spray coating system comprising an ultrasonic transducer with spray forming head, integrated fluid delivery device with air and liquid supply passage ways, support brackets and an ultrasonic power generator.

27 Claims, 13 Drawing Sheets

FIG. 7E
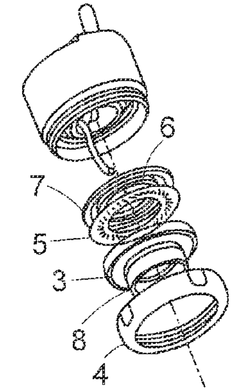
FIG. 7F
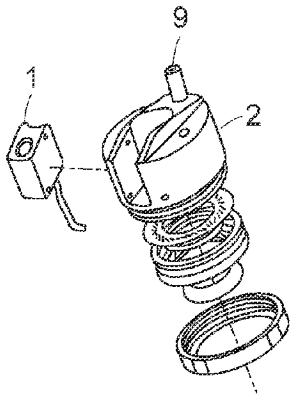
FIG. 7C
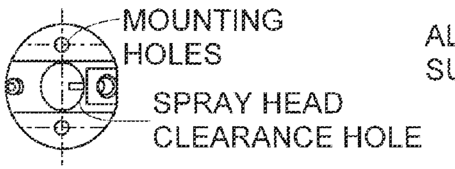
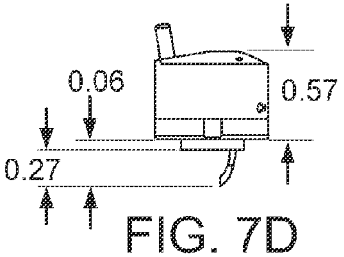
FIG. 7D
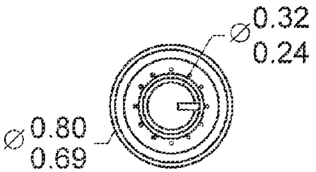
FIG. 7G
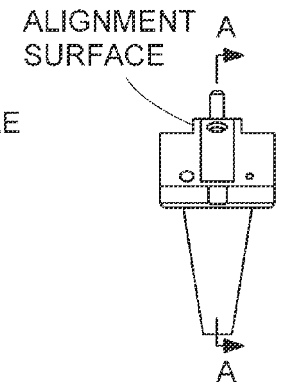
FIG. 7B
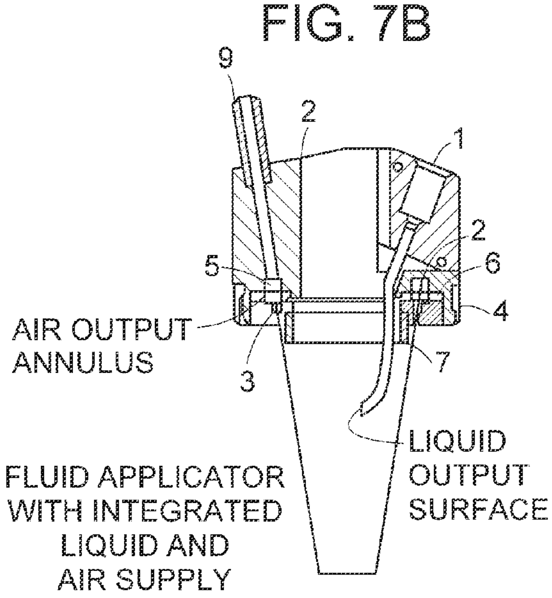
FIG. 7A
| ITEM | DESCRIPTION |
|---|---|
| 1 | LIQUID APPLICATOR |
| 2 | FLUIDS APPLICATOR BODY |
| 3 | AIR SHAPING RING |
| 4 | AIR SHAPING RING RETAINER |
| 5 | AIR DIFFUSER |
| 6 | INNER GASKET |
| 7 | OUTER GASKET |
| 8 | AIR SHROUD |
| 9 | AIR INLET |
| 10 | AIR PASSAGEWAY |
| 11 | LIQUID PASSAGEWAY |

| ITEM | QTY | DESCRIPTION |
|---|---|---|
| 1 | 1 | ULTRASONIC TRANSDUCER |
| 2 | 1 | MICRO FLOW CONTROL VALVE |
| 3 | 1 | AIR FLOW CONTROL VALVE |
| 4 | 1 | LIQUID FEED TUBE |
| 5 | 1 | INTEGRATED FLUIDS APPLICATOR |
| 6 | 1 | SPRAY HEAD MOUNTING BRACKET |
| 7 | 1 | MOUNTING THUMB SCREW |
| 8 | 1 | FLUIDS APPLICATOR MOUNTING BRACKET |
| 9 | 1 | CAM ADJUSTER |
| 10 | 1 | MICRO FLOW CONTROL BRACKET |
| 11 | 1 | FILTER BRACKET |
| 12 | 1 | FLUID FILTER |
| 13 | 1 | LIQUID SUPPLY TUBE |

ULTRA-SPRAY CAT 35 ILDS HEAD
NOMINAL SPRAY PATTERN

ULTRA-SPRAY CAT 35 ILDS HEAD

NARROW MODE-WIDE MODE-SIDE SPRAY MODE

SIDE SPRAY MODE

WIDE SPRAY MODE

COATING SYSTEM

CROSS-REFERENCE TO RELATED APPLICATIONS

This application is a continuation of application Ser. No. 11/331,412 filed Jan. 11, 2006 now abandoned. The '412 application claims priority from U.S. Provisional Application Ser. No. 60/643,024, filed 11 Jan. 2005. The '412 application is also a continuation-in-part of application Ser. No. 10/927,547, filed 26 Aug. 2004 now abandoned. The '547 application was a continuation-in-part of PCT Application No. PCT/US2004/009549 filed 29 Mar. 2004, which designates the United States. The PCT Application claimed priority from commonly owned, U.S. Provisional Application Ser. No. 60/458,487, filed 28 Mar. 2003. The disclosures of these applications are hereby incorporated herein by reference.

FIELD OF THE INVENTION

The present invention provides a coating system that represents an improvement over prior art coating systems, in which a precision dispensing valve, for coating small areas, is used in conjunction with a spray or other large area coating device.

BACKGROUND OF THE INVENTION

The present invention provides a coating system that represents an improvement over the coating systems described in U.S. Pat. Nos. 5,409,163, 5,540,384, 5,582,348 and 5,622,752, the disclosures of which are hereby incorporated herein by reference. The coating system of the present invention can be used in the methods taught in these patents, and can also be used as described herein.

There is an increasing need in industry to apply coatings to selected areas on a substrate, for example applying protective coatings to printed circuit boards. In this example, a protective coating needs to be applied to soldered connections and not to other areas such as electrical connectors, heat sinks, light emitting diodes (LED) or displays. In many cases, the areas to be coated are immediately adjacent to the areas where coating cannot be applied. If coating is applied to the "no-coat" areas, the circuit board will not function properly due to the presence of the coating.

In many cases it is necessary to apply a masking material, such as tape, to the no-coat areas prior to application of the coating to ensure that these areas remain free of coating. Typically the masking is applied prior to application of coating and removed after the coating is dry. The application and removal of the masking material is time consuming and labor-intensive. The elimination of the masking process is desirable in a manufacturing process to reduce production time and reduce labor costs, especially for high volume production.

In recent years, automated coating systems have been developed for the application of coatings with the goal of eliminating the masking and de-masking process. The systems typically consist of a coating applicator for large areas, a coating applicator for small areas, a motion and positioning mechanism for the coating applicators and a system controller.

Typically spray valves or film coating heads are used for coating the large areas on the substrate quickly to minimize time required for coating application. However, typical large area coating applicators deposit the coating patterns with irregular edges. The coating cannot be applied close to the no-coat areas with these applicators due to the irregular edge of coating deposition. In order to reach the goal of elimination of masking another applicator is required to coat the smaller areas immediately adjacent to the no-coat areas of the substrate.

Typically dispensing valves that produce a bead or line of coating are used for coating small areas on the substrate. The dispensing valves are comprised of a piston actuated internal needle in seat arrangement. An air-actuated piston that raises the needle out of the seat is used to activate the coating flow. A stroke of the piston is manually adjusted to set the flow rate of the coating. The coating flows from the valve in the form of a bead or is directed through an external needle to the substrate.

The motion and positioning system is used to move both coating applicators over the substrate to apply coating to the desired areas. The system controller operates the motion and positioning system as well as the coating applicators and enables programs to be created and stored for various coating patterns.

These automated systems have been effective in certain circumstances but they do not produce a uniform coating application and have not completely eliminated the requirement for masking.

In many cases, it is desirable to apply a thin, uniform coating to a substrate, such as the application of protective coatings to printed circuit boards. For example, the coating thickness must be precisely controlled with the new water-based conformal coatings. If these coatings are applied at a greater thickness than is optimal for curing, cracks will form during the drying process, reducing the coating's protective properties. Spray coating applicators are capable of applying a thin coating on a substrate. To facilitate spray application and formation of a thin film on the substrate, the coating is typically formulated with a lower viscosity of less than 100 Centipoise. However, difficulties arise if the same low viscosity coating formulation is used in the dispensing valve. The dispensing valve produces a bead or line of coating on the substrate and the coating will tend to flow or wet out on the substrate unpredictably with low viscosity coating mixtures. To overcome this problem, higher viscosity coating formulations are used with the dispensing valves, which produce a thicker coating application than the spray valve. The use of a low viscosity formulation for the spray applicator and a higher viscosity coating formulation with the dispensing applicator results in a non-uniform coating on the substrate.

Additional limitations of dispensing valves include imprecise flow rate control, difficulty producing short coating lines segments, heavy coating deposition at the start and end of a coating segment and susceptibility to uneven or warped substrate surfaces. The coating flow rate on a dispensing valve is set with a manual screw adjustment to adjust the stroke of the piston. This manual adjustment is subjective and will necessarily produce different results each time to valve is adjusted.

The needle and seat arrangement of dispensing valves produces discontinuities as the flow starts and stops. This coupled with the head motion profile tends to produce heavy spots at the start and end of a coating segment and makes is difficult to create a short coating segment. This effect can somewhat be overcome with programming techniques for the system controller, but this process is tedious and not repeatable. To apply coatings accurately to very small areas or in straight lines with a dispensing valve, an external needle is required. To achieve optimal results, the outlet of the needle must be very close to the substrate, typically within 1 mm. If the substrate is uneven or slightly warped coating skips may result due to changing distance between the needle and substrate. Additionally, the needle has a tendency to contact previously applied coating and pull it along with it causing skips and smears. The needle is also subject to being damaged if it comes into contact with the substrate.

In summary, the limitations of current selective coating systems include:

(1) Inability to provide a uniform coating thickness for both large and small areas to be coated.

(2) The requirement to use different coating formulations for the coating applicator for the large areas and the coating applicator for the small areas.

(3) Manual adjustment of the coating flow rate, which produces inconsistent results, due to subjective process setup.

(4) Difficulty controlling the dispensing process due to unpredictable coating flow-out on the substrate, heavy spots ant the beginning and end of coating segments and susceptibility to irregular substrate surfaces.

SUMMARY OF THE INVENTION

One embodiment of the present invention provides a coating system for the application of coatings to substrates without the need for masking.

In one especially preferred embodiment, the system comprises a first coating applicator for coating large areas of the substrate, and a second coating applicator for coating small areas of the substrate. It also comprises a motion and positioning system for both coating applicators and a system controller. In an especially preferred embodiment, this invention utilizes a device to produce very small coating segments in conjunction with the large area coating applicator to eliminate the limitation of currently available selective coating systems that utilize needle in seat dispensing valves.

This embodiment of the present invention achieves the following benefits over the systems of prior art:

(1) Supplement to a coating applicator for larger areas, such as a precision ultrasonic spray head or other large area coating head, to apply coatings to selected very small areas of a substrate, as small as 1 $mm^2$, at the same resulting coating thickness as the coating applied with the large area coating applicator.

(2) Apply low viscosity liquids of the same formulation and viscosity used by the other spray or coating applicator used to apply coating to larger areas.

(3) Produce a small coating segment in the form of a thin line or dot (approximately 1 mm coating segment width).

(4) Use a common liquid storage and delivery system between the coating applicator for large areas and the dispensing head.

(5) Apply the coating accurately from a distance up to 20 mm above the substrate.

(6) Adjust the coating flow rate electronically using a drive circuit for the dispensing head. This eliminates subjective manual adjustments associated with conventional dispensing valves.

(7) Use a multi-axis motion and positioning system (X-Y-Z-θ-Ø) to control the velocity and position of both the large area coating applicator and the small area coating applicator.

Another embodiment of the present invention provides an ultrasonic spray coating system comprising an ultrasonic transducer with spray forming head, integrated fluid delivery device with air and liquid supply passage ways, support brackets and an ultrasonic power generator.

This embodiment of the invention preferably comprises an ultrasonic spray coating system with an integrated fluid applicator. In one especially preferred embodiment, the system is capable of spraying liquids onto substrates in narrow (1/16" to 3/16" wide), well-defined patterns at a distance of up to 1.75 inches from the substrate.

In addition to the directed air stream produced by the air-shaping ring to focus the spray the following additional embodiments have been made:

1) An air director and mounting ring.

2) A pneumatically actuated air director positioner for the air director.

3) Two additional solenoid valves to activate air flow to the air director and to the air director positioner.

These improvements enable the spray head to operate in any one of the following three-modes (or combinations thereof):

1) Narrow mode—where the airflow is directed through the air-shaping ring to focus the ultrasonically produced spray.

2) Wide mode—where the airflow is directed through the air director to expand the ultrasonically produced spray. Impinging the directed air stream on the flat surface of the spray-forming tip expands the spray. The directed air stream is impinged on the opposite surface to the liquid feed surface.

3) Side mode—where the air director positioner is actuated, moving the air director to the lower position and airflow is directed through the air director to direct the ultrasonically produced spray at an oblique angle from the spray forming tip. The purpose of directing the spray at an oblique angle is to coat a vertical surface, such as the side of a tall component that would not otherwise be coated if the spray were directed in the normal vertical path.

In many coating applications, such as the application of conformal coatings to printed circuit boards, there are various size areas that require a uniform coating. Due to production volume, the time available to apply the coating may be limited. It is critical to have the ability to accurately apply coatings to small areas without applying coating to adjacent areas or components (keep out areas). This can be achieved with a narrow, focused spray pattern. However, if a larger area needs to be coated, many passes will be required with the narrow width spray. This may exceed time limitations imposed by production volume. A wider spray pattern will enable larger areas to be coated more quickly. Additionally, coating may need to be applied to the side surfaces of taller components. A spray applicator that is able to deliver a narrow pattern for small areas, a wider pattern for larger areas as well as the ability to apply coating to the side surfaces of taller components would meet these requirements.

Thus, the improved spray head embodiment of the present invention provides the following benefits:

1) The ability to apply a narrow coating pattern and a wider coating pattern with the same spray head.

2) The ability to apply a narrow coating pattern, a wider coating pattern and a sideways coating pattern with the same spray head.

3) The ability to change between the three modes of operation without manual adjustments. Pattern changes are initiated through the coating system software and control components.

4) The ability to expand the narrow coating pattern by a multiple of up to 5 times the narrow pattern width. For example, from a narrow pattern width of 5 mm, to a wide pattern width of 25 mm.
5) The ability to significantly reduce the time to coat a substrate with both small areas and large areas to be coated.

The ultrasonic transducer consists of an ultrasonic converter that converts high frequency electrical energy into high frequency mechanical energy. The converter has a resonant frequency. A spray forming head is coupled to the converter and is resonant at the same resonant frequency of the converter. The spray forming head has a spray-forming tip and concentrates the vibrations of the converter at the spray-forming tip.

The integrated fluid applicator contains separate passageways for liquid and air, a liquid output surface, an air output annulus and an air-shaping ring. The fluid applicator has separate ports for air and liquid. The air inlet port is connected to a ring shaped annulus. The inlet port for liquid is connected to the output surface of the applicator. The air-shaping ring attaches to the bottom of the fluid applicator to enclose the air annulus to form an air passageway to supply air to the holes in the air-shaping ring. The angle of the holes in the air-shaping ring can be set to achieve a specific "focal point" of the liquid spray, thus producing the desired spray pattern size.

The spraying end of the system contains the necessary elements to produce the desired spray pattern: 1) atomizing surface of the spray forming head, 2) liquid applicator output surface and 3) air delivery ring. These elements are arranged in a manner that allows the spraying end to be contained within a small in area (less than 0.75 in×0.69 in). This small envelope allows the spray system to be positioned in tight areas for spray coating between objects protruding from the substrate (e.g., components attached to a printed wiring board).

As set forth in greater detail below, embodiments of the ultrasonic spray coating system of the present invention comprise an ultrasonic spray head assembly and an ultrasonic power generator. The ultrasonic spray head assembly consists of two major components: 1) an ultrasonic transducer with spray forming head and 2) an integrated fluid applicator. This system is constructed in the same manner, and from the same materials, as are the prior art ultrasonic spray systems defined in the patents recited above. The prior art systems are commercially available from Ultrasonic Systems, Inc. of Haverhill, Mass., the assignee of the present invention.

This embodiment of the present invention can be used for applying thin, uniform coatings to virtually any substrate. In particular, this device can be used to apply conformal coatings to printed circuit board assemblies, either to cover the entire board assembly or to apply the coating selectively to the board. The advantages that this device provides over conventional spray devices include:

(1) Improved transfer efficiency—over 90% of the sprayed coating is transferred to the board vs. 40% to 60% for air assisted spray nozzles;
(2) Smooth, defect free coatings—since the primary mechanism for atomization is ultrasonic, the applied coating appears smooth and is free of bubbles and pinholes. Conventional air assisted spray nozzles use compressed air to atomize the coating, which results in a coating that has an "orange peel" like appearance and can have bubbles and pin holes due to the atomizing air pressure. To overcome these "defects" air assisted nozzle coatings are applied in higher volume resulting in a thicker coating—typically between 0.005" to 0.010";
(3) Thinner coatings—since this device provides a uniform, defect free coating the resulting coating thickness is typically between 0.001" to 0.005". The thinner, defect free coating applied at a higher transfer efficiency results in coating material savings.
(4) In certain embodiments, finer, more narrow spray patterns—the air shaping ring, as part of the integrated fluid applicator allow the spray pattern to be focused and to allow superior "edge definition" at a greater distance from the substrate allowing for greater flexibility in positioning the spray device for selectively coating a populated circuit board.
(5) More precise control over coating deposition—since the liquid is applied externally to the vibrating spray forming tip, precise amounts of liquid can be applied to the tip and dispersed as a spray to the substrate providing precise coating deposition control.

This device can also be used to apply proprietary liquid coatings to green tape used in the production of fuel cells. Other applications include applying: "micro volume" liquid coatings to semiconductors devices (e.g., flux to solder balls (C4 technology) for flip chips), polymer coatings (drug coatings) for stents, conductive inks on ceramic substrates and many more. Many of the advantages listed above over existing spray nozzle technology are applicable to these applications.

This device will typically be attached to an end effector that is part of an X, Y, Z programmable robot that controls the position and speed of the device relative to the substrate, thereby, allowing the user to apply coatings of any desired pattern to the substrate.

Finally, the two preferred embodiments described herein, can be combined, either in whole or in part, to achieve coating systems having the combined attributes of each preferred system.

BRIEF DESCRIPTION OF THE DRAWINGS

FIG. 7, which includes seven parts (7A, 7B, 7C, 7D, 7E, 7F and 7G) illustrates the Integrated Liquid Delivery System (ILDS) employed in a spray head embodiment of the present invention.

DETAILED DESCRIPTION OF THE PREFERRED EMBODIMENTS

As depicted in FIGS. 1-4, one embodiment of the present invention comprises a spray coating system for the selective application of coatings to substrates to apply a uniform coating to selected areas of the substrate without the need for masking.

The preferred embodiment of the system comprises a first coating applicator for coating large areas of the substrate, a second coating applicator for coating small areas of the substrate, a motion and positioning system for both coating applicators and a system controller. The focus of this invention is the integration of a device for producing small coating segments with the other components of the coating system.

In a preferred embodiment, the first coating applicator—i.e., the applicator for larger areas, is a precision ultrasonic spray head or other large area coating head. The second coating applicator is specifically designed to apply coatings to selected very small areas of a substrate, for example, as small as 1 $mm^2$, but at the same resulting coating thickness as the coating applied with the first applicator—the large area coating applicator. The small coating segment can be in the form of a thin line or dot of approximately 1 mm coating segment width. Other desired spray patterns and sizes can be selected by the user. The two applicators advantageously use a common liquid storage and delivery system, thereby maintaining a consistency and uniformity for the coatings applied by the two applicators. In the preferred embodiment, these coatings can accurately be made at a distance of up to 20 mm above the substrate. The coating flow rates are adjusted electronically using a drive circuit for the dispensing head. This eliminates subjective manual adjustments associated with conventional dispensing valves. Finally, the preferred system includes a computer controlled multi-axis motion and positioning system (X-Y-Z-θ-Ø) to control the velocity and position of both the large area coating applicator and the small area coating applicator. Such systems are commercially available.

Several spray coating systems with which the precision dispensing valve can be used are those taught in U.S. Pat. Nos. 5,409,163, 5,540,384, 5,582,348, 5,622,752, and U.S. Patent Publication No. 2005-0035213, the disclosures of which are hereby incorporated herein by reference. The skilled artisan can likewise select other commercially available large area coating devices, including, but not limited to, air atomized spray valves, and other film coat applicators heads, and/or valves, such as those available from Asymtek of Carlsbad, Calif., for use with the precision dispensing valve, without departing from the scope of this invention.

The Micro-Line Dispensing System

Figure 1:
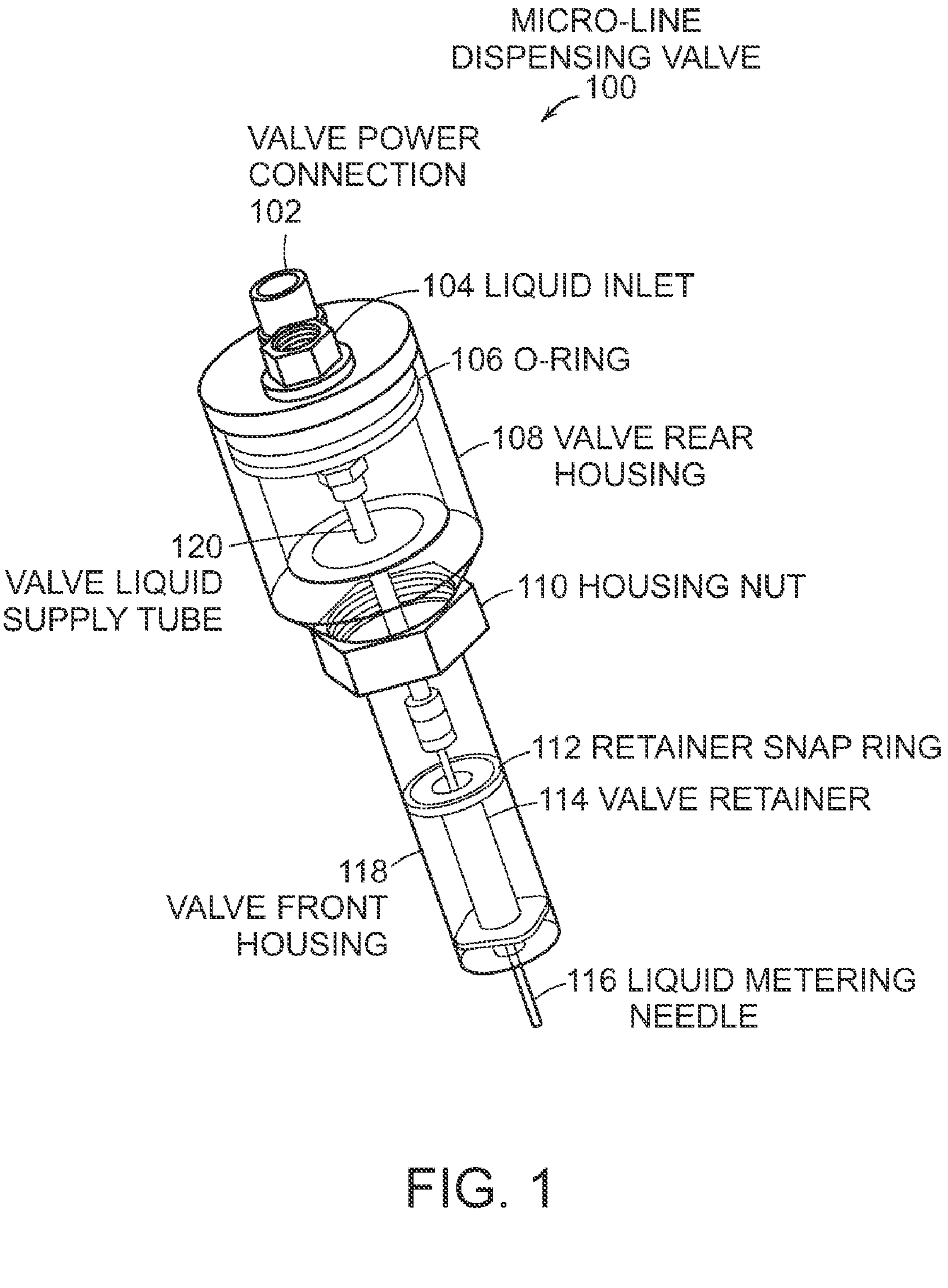
FIG. 1 illustrates a preferred Micro-Line Dispensing valve used in the coating system embodiment of the present invention.

As illustrated in FIG. 1, the Micro-Line Dispensing Valve 100 includes the following functional components; valve power connection 102, liquid inlet 104, O-ring 106, valve rear housing 108, housing nut 110, retainer snap ring 112, valve retainer 114, liquid metering needle 116, valve front housing 118, and valve liquid supply tube 120.

Figure 2:
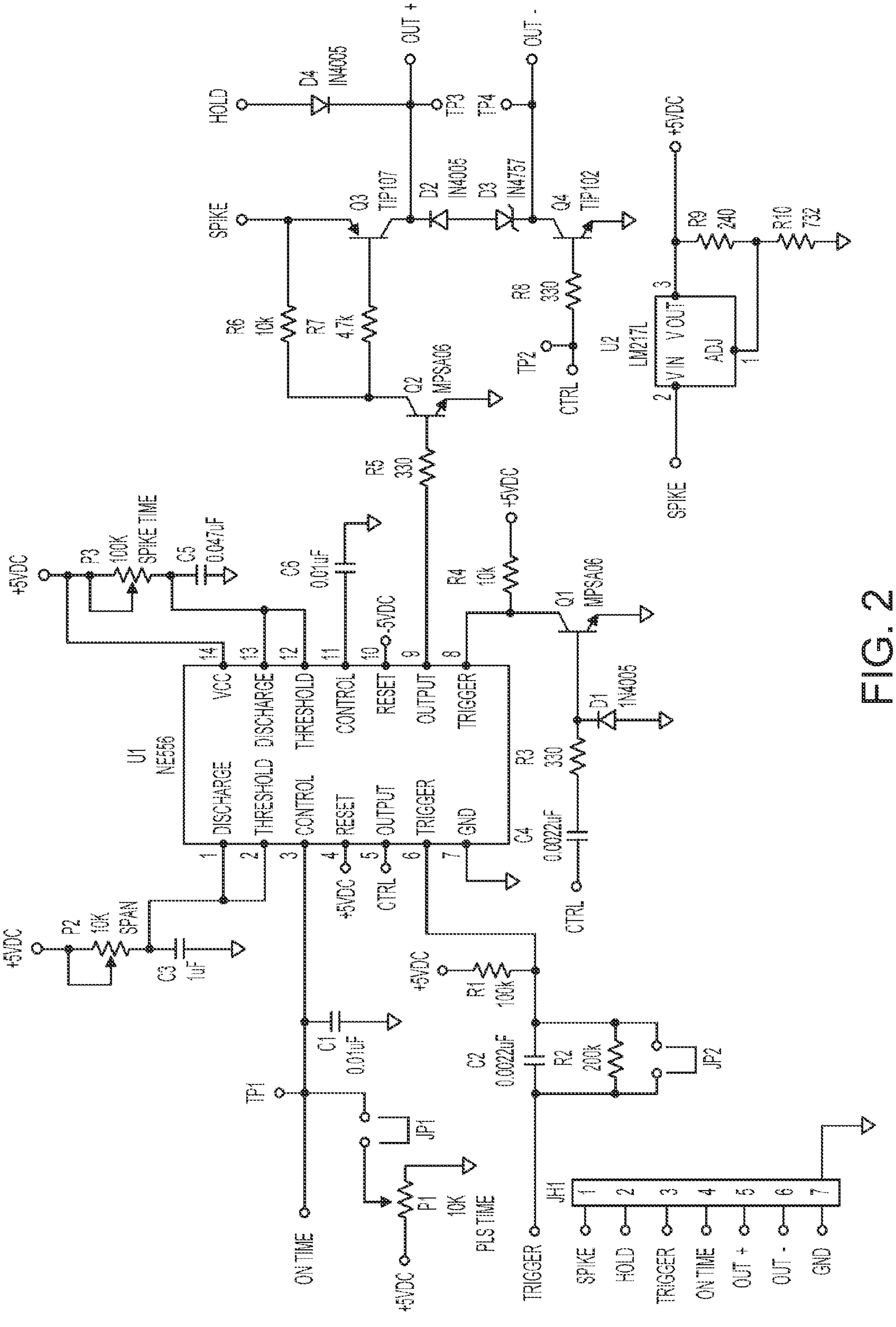
FIG. 2 illustrates a circuit diagram used with preferred embodiments of the coating system of the present invention.

In addition to the valve parts shown in FIG. 1, the micro-line dispensing head further includes the high-speed driver circuit shown in FIG. 2. Needle 116 includes a precision orifice. The orifice and needle are connected to the outlet of the solenoid valve. The coating liquid is delivered to the inlet of the solenoid valve from the storage reservoir by pressurizing the reservoir with up to 30 PSI. The solenoid valve is pulsed rapidly by the driver circuit (see FIGS. 2 and 3) and the liquid is forced through the orifice and directed through the needle in the form of a small stream.

The stream of coating is deposited on a substrate by moving the dispensing head relative to the substrate producing a coating segment. The width of the coating segment is proportional to the velocity of the dispensing head and the liquid flow rate.

The preferred Micro-Line solenoid valve is commercially available from The Lee Company, Westbrook, Conn. The solenoid valve is chemically inert, has a response time of less than 0.25 milliseconds and operates at speeds up to 1200 Hz. The valve has an open flow capacity, with water, of 20 cc/min at 20-PSI pressure (see FIG. 4).

In operation, first the dispense volume per pulse is determined ON time ($T_{ON}$) of the valve. This is based upon the type fluid to be dispensed. The effective flow rate is calculated by multiplying the number of pulses per second (or operating frequency) of the valve. The ON time of the valve can be varied from between 0.2 milliseconds and 0.5 milliseconds. The operating frequency of the valve can be varied from 10 Hz to 1200 Hz. This system can accurately control flow from 0.5 microliters/second to 800 microliters/second (based on water at standard temperature and pressure).

Figure 3:
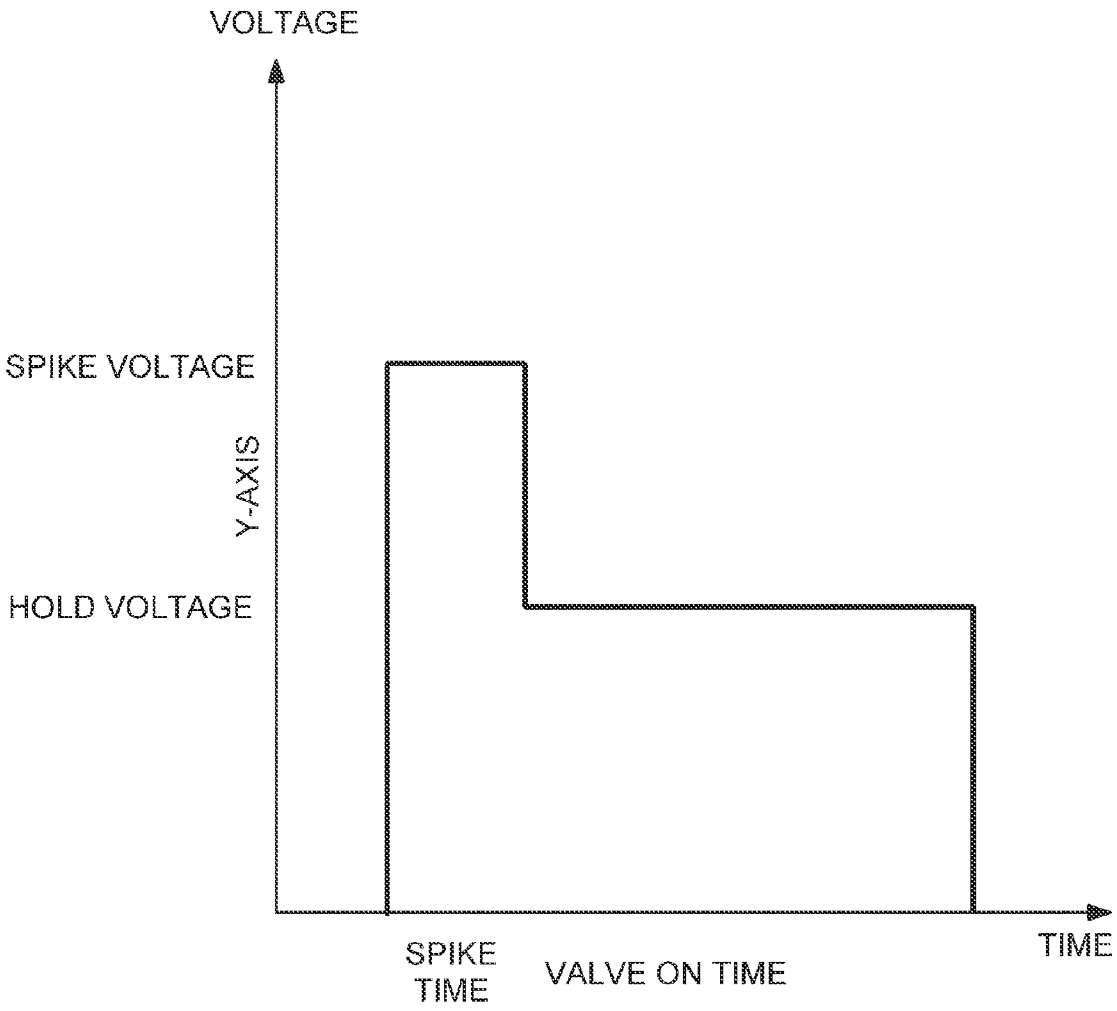
FIG. 3 is a graphical representation of Voltage (specifically Spike Voltage and Hold Voltage) vs. Valve ON Time ($T_{ON}$) for the valves used in preferred embodiments of the coating systems of the present invention.
Figure 4:
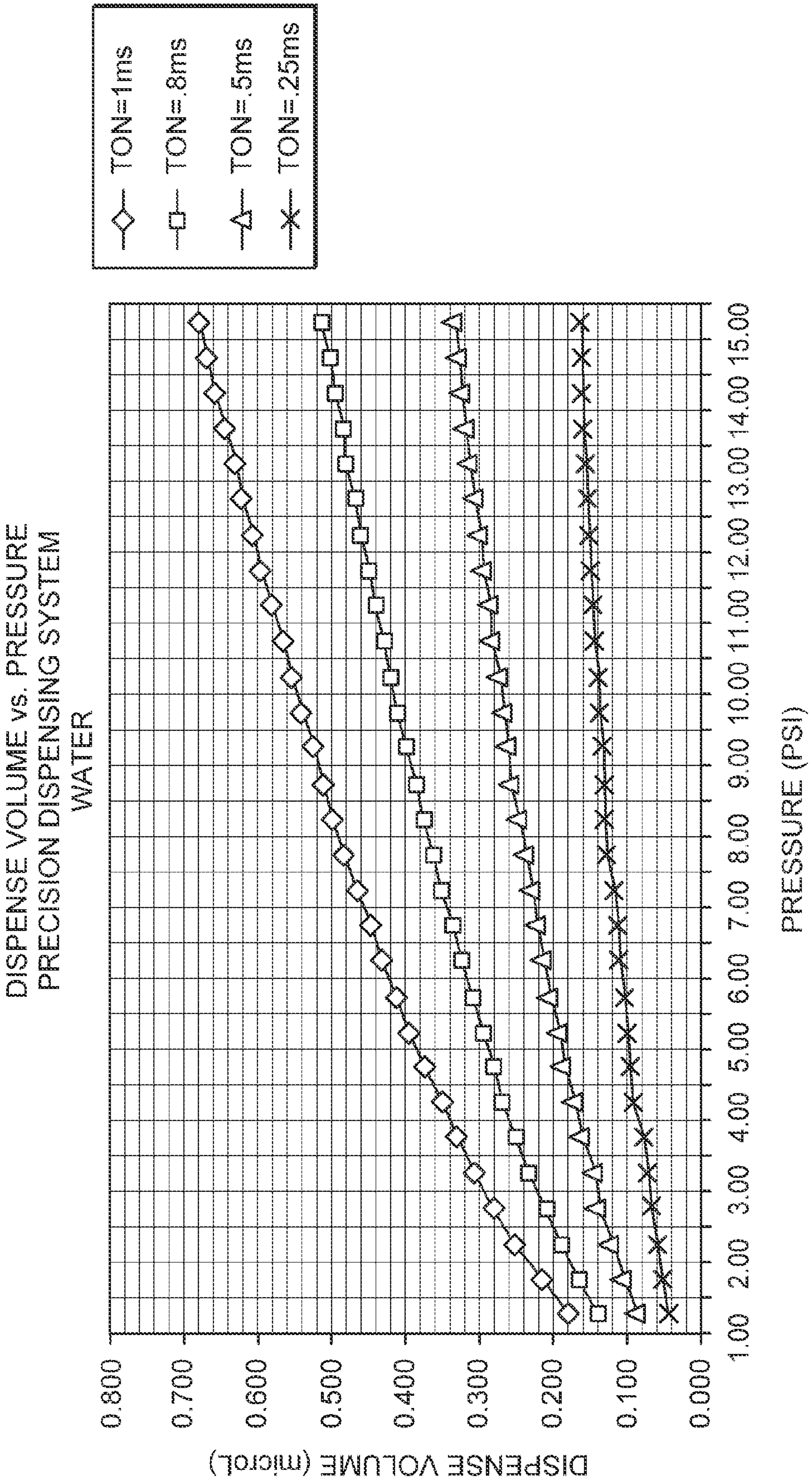
FIG. 4 is a graphical representation of Dispense Volume (in microliters) vs. Pressure (in PSI) for water (dispensed as a test liquid) by embodiments of the coating system of the present invention.

As shown in FIGS. 2 and 3, a high-speed driver circuit is used to operate the solenoid valve. This circuit applies a high voltage level to the valve (called the "spike voltage") to quickly open the valve, and then applies a lower voltage (called the "hold" voltage") to keep the valve open. The length of time the spike voltage is applied is set via potentiometer P3. The total time the valve is to be kept open is set either by potentiometer P1, or via a 0-5V signal applied to the "On Time" terminal. The range of time that the valve is held open is set via potentiometer P2. Momentarily switching the "Trigger" terminal to ground via and external controller activates the circuit. The switching time of the external controller set the valve operating frequency.

As illustrated in FIGS. 5-13, another embodiment of the ultrasonic spray coating system comprises of an ultrasonic spray head assembly. This ultrasonic spray head assembly consists of two major components:

(1) an ultrasonic transducer with spray forming head and (2) an integrated fluid applicator.

Spray Head Description

Figures 5A, 5B, 5C, 5D, 5E, 5F:
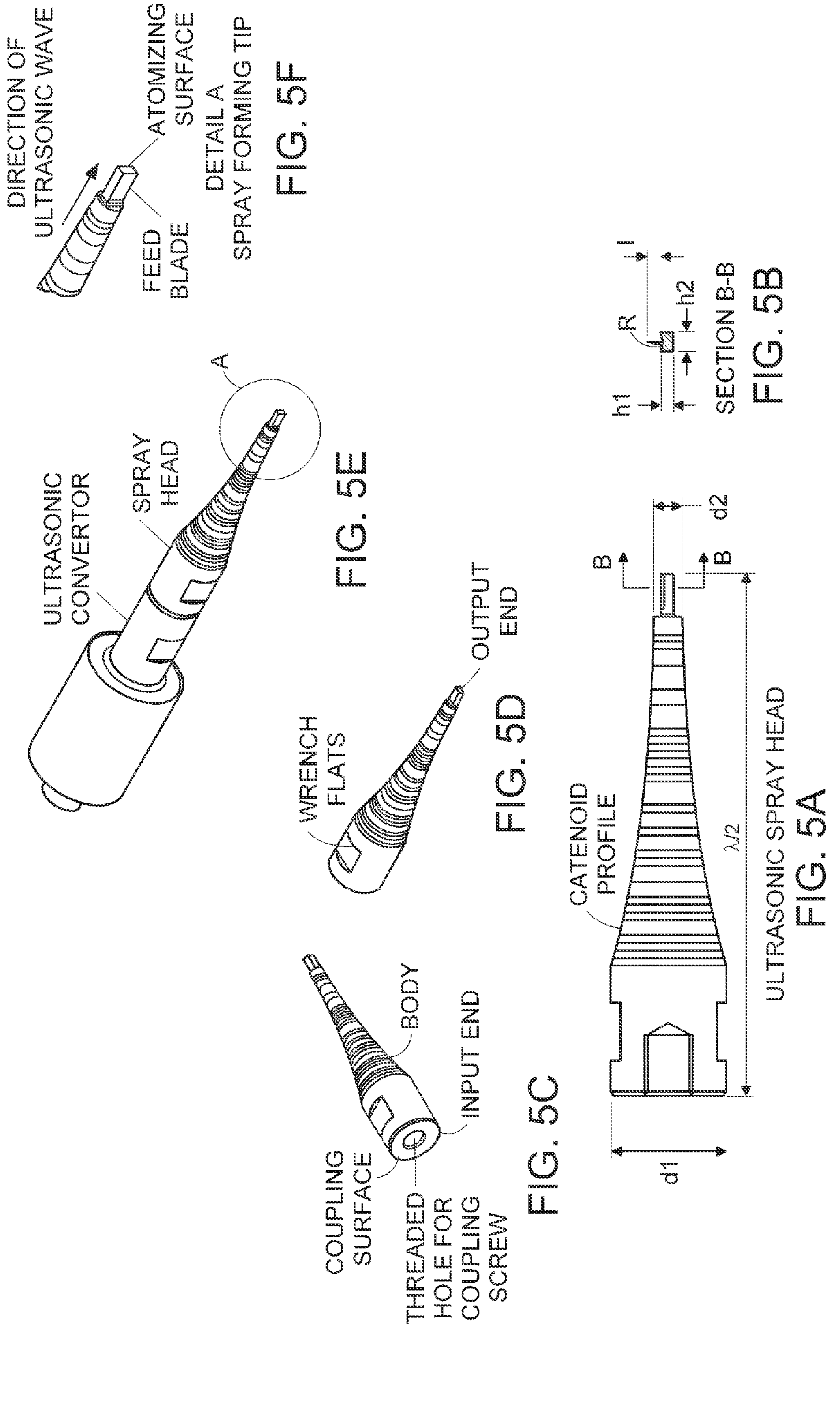
FIG. 5, which includes six parts (5A, 5B, 5C, 5D, 5E and 5F) illustrates a preferred spray head embodiment of the present invention.

Referring in detail to FIG. 5, the ultrasonic spray head is comprised of an input end, a body and a spray forming tip. The spray forming tip or output end contains a feed blade and an atomizing surface. The spray head has a resonant frequency (fsh) and has a length equal to one-half wavelength (λ/2) of the resonant frequency. The wavelength for a particular spray head is defined by:

$$\lambda = cm/fsh$$

Where:
λ=Wavelength (inches)
Cm=material's speed of sound (inches/second)
fsh=resonant frequency (Hertz or 1/second)

The practical resonant frequencies range from 20 kHz to 120 kHz for atomizing liquids (20 kHz≧fsh≦120 kHz). The spray head is constructed of metal, either 6Al-4V titanium or 7075-T6 aluminum; titanium is preferred because of its strength and corrosion resistance properties.

The input end is comprised of a coupling surface and a coupling screw. The input end of the spray head is connected to an ultrasonic converter. The input must be flat and smooth for optimal mechanical coupling to the converter. The ultrasonic converter has a resonant frequency (fc) that is matched to the resonant frequency of the spray head (fsh) or fc=fsh.

The body connects the input end to the output end and is formed to concentrate ultrasonic vibrations on the output end. To achieve ultrasonic amplification through the body, the input end must be larger than the output end. The profile of the body can be stepped, linear, exponential or Catenoid. The Catenoid shape is preferred because it provides the largest amplification of the sound wave through the body to the output end, which in turn, provides maximum atomizing capability. Preferable ratios of output end diameter (d2) to input end diameter (d1) are:

$$4 \geqq (d1/d2) \leqq 8$$

The Catenoid shape is described by the catenoidal equation:

$$Y = Yo * \cosh[m(X - Xo)]$$

Where:
X→X coordinate
Y→Y coordinate at X
Xo→X coordinate of the lowest point on Catenoid
Yo→Y coordinate of the lowers point on Catenoid
Cosh→hyperbolic cosine
M→Constant (depends on the end points of the catenoid)

The spray forming tip has two main features: 1) an atomizing surface that provides concentrated ultrasonic vibrations with sufficient energy to atomize a flowing liquid, 2) a feed blade that allows a liquid that is applied to it to flow to the atomizing surface.

The spray forming tip is preferably rectangular but it can be round or square. The shape of the spray forming tip influences the shape of the spray that forms on the atomizing surface. A round tip produces a more or less round spray, a square tip produces a more or less square spray and a rectangular tip produces a more or less rectangular spray.

The purpose of the feed blade is to direct all of the liquid flow towards and onto the atomizing surface. The feed blade shape can be convex (round), concave or flat. With a round or convex feed blade the liquid streams to the atomizing surface but some also flows around the spray forming tip before finally reaching the atomizing surface. The flat feed blade performs better with most of the liquid going to the atomizing surface, however some liquid still flows onto the sides of the feed blade before going to the atomizing surface. This spurious liquid flow causes the spray pattern to become erratic resulting in ragged, ill defined edges on the coating pattern.

Figure 6:
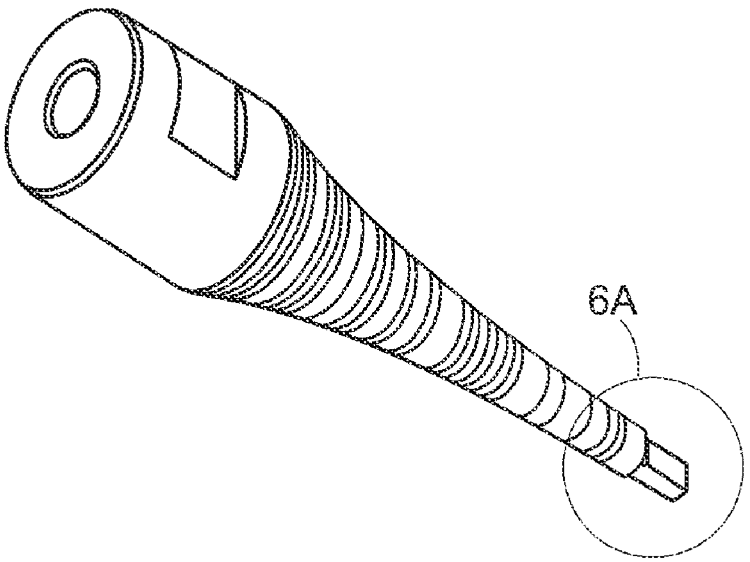
FIG. 6, which has two parts (6 and 6A) illustrates the preferred concave feed blade of a spray head embodiment of the present invention.
Figure 6A:
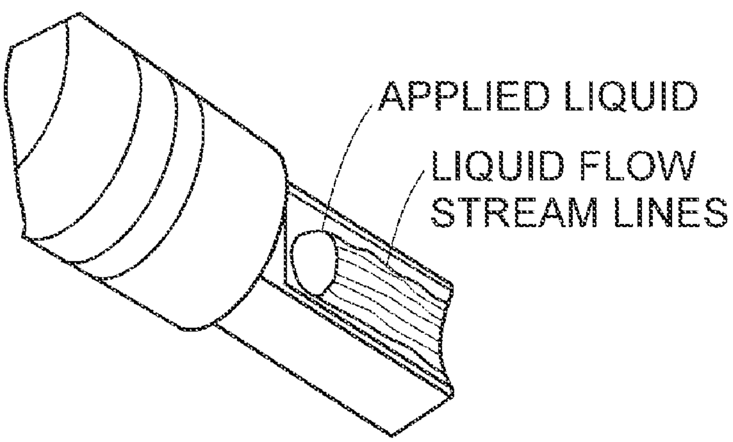
Figure 8E:
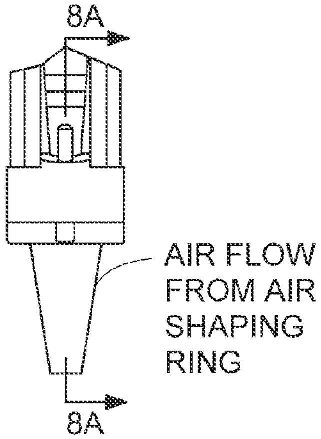
FIG. 8, which includes five parts (8A, 8B, 8C, 8D and 8E) illustrates the Air Shaping Ring of the Integrated Liquid Delivery System (ILDS) employed in a spray head embodiment of the present invention.
Figure 8D:
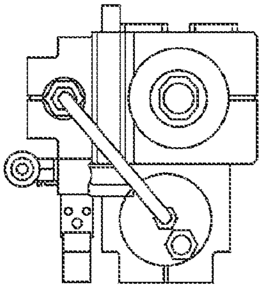
Figure 8A:
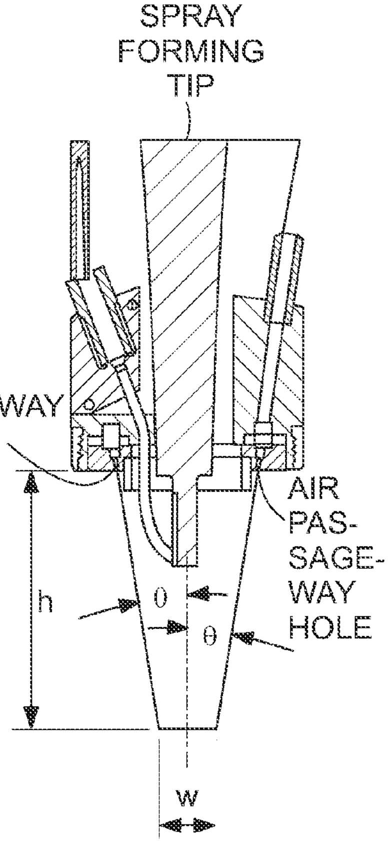
Figure 8C:
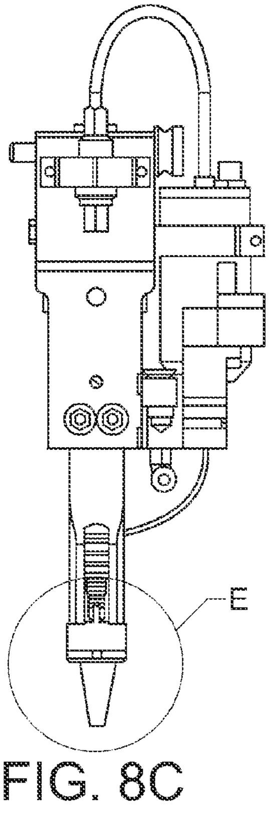
Figure 8B:
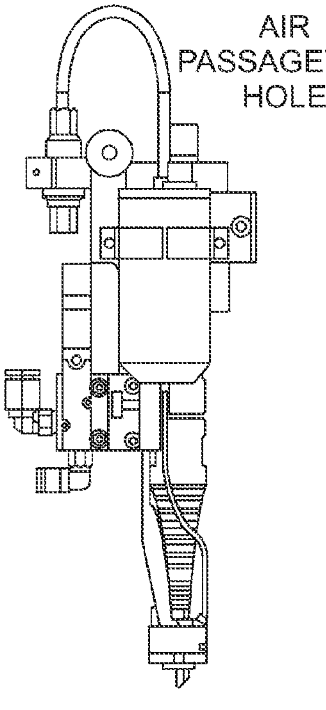

Referring in detail to FIG. 6, a concave feed blade performs best because the dish shaped surface helps to contain the flow to the feed blade causing all of the liquid to flow directly to the atomizing surface. The concave feed blade eliminates spurious liquid flow and therefore facilitates a coating pattern with well defined edges.

This embodiment of the present invention further comprises an ultrasonic spray coating system with a converter mechanism for converting high frequency electrical energy into high frequency mechanical energy to thereby produce vibrations. The converter mechanism is designed to have one resonant frequency. A spray forming head is coupled to the converter mechanism and is resonant at the same resonant frequency. The spray forming head has a spray forming tip and concentrates the vibrations of the converter at the spray forming tip. The spray forming tip has a feed blade and an atomizing surface. The spray forming tip concentrates a surface wave on the feed blade and a displacement wave on the atomizing surface from the vibrations of the converter. A high frequency alternating mechanism is electrically connected to the converter mechanism to produce a controllable level of electrical energy at the proper operating frequency of the spray forming head/converter mechanism such that the spray forming tip is vibrated ultrasonically with a surface wave concentrated on the feed blade and a displacement wave concentrated on the atomizing surface.

A liquid supplier is provided having a liquid applicator in close proximity with the feed blade of the spray forming tip and spaced therefrom. The liquid applicator includes an output surface having an orifice therein. The output surface is in close proximity with the feed blade of the spray forming tip and spaced therefrom. The output surface of the liquid applicator and the feed blade of the spray forming tip are at substantially right angles to each other such that liquid supplied from the liquid applicator forms a bead or meniscus between the output orifice of the liquid applicator and the feed blade of the spray forming tip. The meniscus is formed and sustained by the flow of liquid from the output orifice of the liquid applicator and the ultrasonic surface wave that exists on the feed blade of the spray forming tip. The ultrasonic surface wave enables the liquid to 'wet-out' and adhere to the feed blade of the spray forming tip. The surface tension of the liquid allows the meniscus to form and constant flow of liquid sustains the meniscus. The longitudinal displacement wave (that displaces the atomizing surface) pumps the liquid from the feed blade to the atomizing surface. A film of liquid then forms on the atomizing surface and is transformed into small drops and propelled from the atomizing surface in the form of a rectilinear spray. Finally, a controllable gas entrainment mechanism is associated with the spray forming head for affecting and controlling the velocity and pattern of the resultant spray.

Integrated Liquid Delivery System (ILDS)

The ILDS provides the liquid delivery means and air delivery means to facilitate a narrow, well defined spray pattern on a substrate. The ILDS: 1) provides the means to apply a flowing liquid to the feed blade of the spray head and 2) provides a directed air stream in the direction of the atomized coating to "focus" the resulting spray pattern onto a substrate. The ILDS is sized to fit the nominal diameter of the spray head. Referring in detail to FIG. 7, an ILDS consists of nine components:

(Item-1) Liquid Applicator
(Item-2) Fluids Applicator Body
(Item-3) Air Shaping Ring
(Item-4) Air Shaping Ring Retainer
(Item-5) Air Diffuser
(Item-6) Inner Gasket
(Item-7) Outer Gasket
(Item-8) Air Shroud
(Item-9) Air Inlet First, the Liquid Applicator attaches through a cutout feature in the side of the Applicator Body. Second, the Air Diffuser mounts concentrically to a seating surface in the bottom of the Applicator Body. Next, the Inner and Outer Gaskets mount concentrically to the Air Diffuser. Then, the Air Shaping Ring mounts against the Inner and Outer Gasket's surface. After that, the Air Shroud is pressed into the Air Shaping Ring. Last, the Air Shaping Ring retainer is threaded to the bottom of the Applicator Body pushing the Air Shaping Ring against the gaskets to form a sealed air passageway.

Air flows from the Air Inlet to the annulus in the Applicator Body, through the diffuser into the air passageway formed by the gaskets and inside surface of the Air Shaping Ring out through the holes in the Air Shaping Ring. The Air Diffuser evenly distributes the air to the holes in the Air Shaping Ring from the air supply port in the Applicator Body. The Air Shroud prevents the air curtain from curling inward towards the spray forming tip and interfering with the ultrasonic atomizing process.

The Air Shaping Ring is used to control the 1) width of the spray pattern, 2) quality of the edges of the coating pattern and 3) to facilitate high quality coating patterns at a distance of more than 20 mm from the substrate. Control over coating width is important to facilitate coating patterns as small as 1 mm (e.g., for applying liquid solder flux to solder balls on a semiconductor package) up to 20 mm (e.g., for applying conformal coating between components on a printed circuit assembly).

Controlling the quality of the coating edges is important to minimize coating going onto areas where it is not wanted. Applying the coating from at least 20 mm away from the substrate is important to avoid objects protruding from the substrate (i.e., for avoiding circuit components on a printed circuit assembly).

Referring in detail to FIG. 8, the Air Shaping Ring delivers a conically shaped air curtain to entrain the atomized liquid flowing from the Spray Forming Tip to create a well-defined coating pattern on a substrate. The width of the spray pattern "w" is determined by the angle ($\theta$) of the air passageway holes in the Air Shaping Ring. In general, when the angle $\theta$ is zero, the spray pattern is widest and there is minimal control over the quality of the edges of the coating. This is because the air curtain does not intersect with the column of atomized coating. It has been found through experimentation that the angle $\theta$ must be between 5 degrees and 15 degrees, depending on the diameter of the hole pattern in the Air Shaping Ring, for optimal coating pattern quality.

The Liquid Applicator is comprised of 1) a liquid applicator block and 2) a liquid applicator feed tube. The liquid applicator block contains a liquid inlet port that is coaxially connected to a liquid passageway that in turn connects to an outlet port. The outlet port provides the mounting means for the liquid applicator feed tube. The liquid applicator feed tube is formed from stainless steel hypodermic tubing and has a straight portion that is the inlet end has a bent portion that is the outlet end. The inlet end of the liquid applicator feed tube is connected coaxially to the outlet port of the liquid applicator block. The Liquid Applicator is mounted to the Applicator Body such that the inlet port and outlet port are at a 22 degree angle with respect to the centerline of the Applicator Body and so that the outlet end of the feed tube is at a 90 degree angle to the centerline of the Applicator Body. The Liquid Applicator is detachable from the Applicator Body for maintenance purposes. The liquid applicator is constructed from stainless steel or engineering thermoplastic such as PPS or PEEK.

The Applicator Body has an outside diameter (OD) and an inside diameter (ID) and a height (h). The inside diameter provides clearance for the spray head and ranges from 6 mm to 10 mm. The outside diameter is a small as practical but large enough to contain the air passageways for the Air Shaping Ring and cutout feature for the Liquid Applicator. The outside diameter ranges from 17.5 mm to 25 mm. The height of the Applicator Body is 14.5 mm. The applicator body has a top surface and a bottom surface that are parallel to each other and perpendicular to the OD and ID. The top surface has two chamfered features that are opposite each other about the centerline axis; the first chamfer starts at the centerline and is cut at a 9 degree angle to the OD of the part, the second chamfer is offset from the centerline and is cut at a 22 degree angle to the OD of the part, 180 degrees opposite the first chamfer. The first chamfer provides a surface for the air inlet port. The second chamfer is to match the angle of the Applicator Block inlet port surface.

The Applicator Body has an air inlet port connected to an air passageway. The air inlet port is perpendicular to the first chamfered surface in the top of the Applicator Body and connects coaxially with an air passageway that goes through to the bottom surface of the Applicator Body.

The Applicator Body has a cutout pocket feature to hold the Liquid Applicator. This feature starts from the top surface and OD of the part and goes 10 mm from the top surface into the applicator body and intersects the ID. The width of the cutout matches the width of the Liquid Applicator and is centered on the centerline of the part, 180 degrees opposite the air inlet port.

The bottom surface of the Applicator Body has an air annulus, seating surfaces for the Air Diffuser, Inner and Outer Gaskets and Air Shaping Ring and a threaded feature that the Air Shaping Ring retainer threads onto. The threads are cut into the OD of the Applicator Body over a 3 mm length from the bottom surface. A seating surface is bored into the part to a 2 mm depth from the bottom surface. An annulus for air is cut into the seating surface 3 mm wide and 1 mm deep such that the air passageway intersects the center of the annulus.

The Air Diffuser distributes the air flowing from one relatively large air supply port in the Applicator Body over many smaller holes to provide an even flow distribution to the air ports in the Air Shaping Ring. The Air Diffuser is a thin disk (0.003 in. thick) with an OD and ID such that it mounts concentric to the ID of the Applicator Body and against the seating surface. The diffuser is made up of one hundred and eight (108) holes arranged in an array of three concentric rings. The inner and outer diameters of the array of holes match the annulus in the Applicator Body so that the array of holes is aligned to the annulus. Each ring has thirty six holes evenly spaced over the diameter. Each hole in each ring is offset by 5 degrees to the hole in the adjacent ring. The effective area of the array of holes should be twice the area of the air supply hole in the Applicator Body.

The Inner and Outer Gaskets provide an air tight seal between the Air Diffuser and the inside surface of the Air Shaping Ring. The annulus between the gaskets and the Air Shaping Ring form the air passageway that supplies air to the holes in the Air Shaping Ring. The gaskets are constructed of a rubber-like material such as a perfluoroelastomer for maximum chemical resistance. The gaskets are 0.75 mm thick. The ID of the inner gasket matches the ID of the Applicator Body and the OD of the Inner Gasket matches the OD of the air annulus. The OD of the Outer Gasket matches the diameter of the seating surface bore and the ID of the Outer Gasket matches the OD of the air annulus.

The Air Shaping Ring is a disk that has an inlet side and an outlet side and is 2 mm thick. The OD of the ring matches the OD bore of the seating surface in the Applicator Body. The ID of the ring matches the ID of the seating surface bore. The inlet side has an air annulus that is 0.25 mm deep and that matches the annulus formed by the inner and outer gaskets. An array of between six (6) and twelve (12) through holes is machined in the annulus at an angle between 5 and 15 degrees with respect to the longitudinal axis of the ring. The diameters of the holes are the same and range from 0.3 mm to 0.5 mm. A counter bore is formed into the outlet side of the Air Shaping Ring to accept the Air Shroud. The Air Shaping Ring is constructed from either stainless steel or an engineering thermoplastic that is chemically resistant, such as PPS or PEEK.

The Air Shroud is a cylindrical shaped device that shields the atomization process on the spray forming tip from the air issuing from the Air Shaping Ring. Without the Air Shroud atomized coating is pulled back into the ILDS by the Air Shaping Ring causing coating material to build up in the ILDS and drip off. Coating material dripping from the ILDS causes defects in the spray pattern and also causes coating to be deposited in unwanted areas. It has been found through experimentation that the Air Shroud should protrude from the outlet surface of the Air Shaping Ring 1.6 mm.

Ultrasonic Spray Head with ILDS and Pulsed Liquid Delivery System

Figure 9:
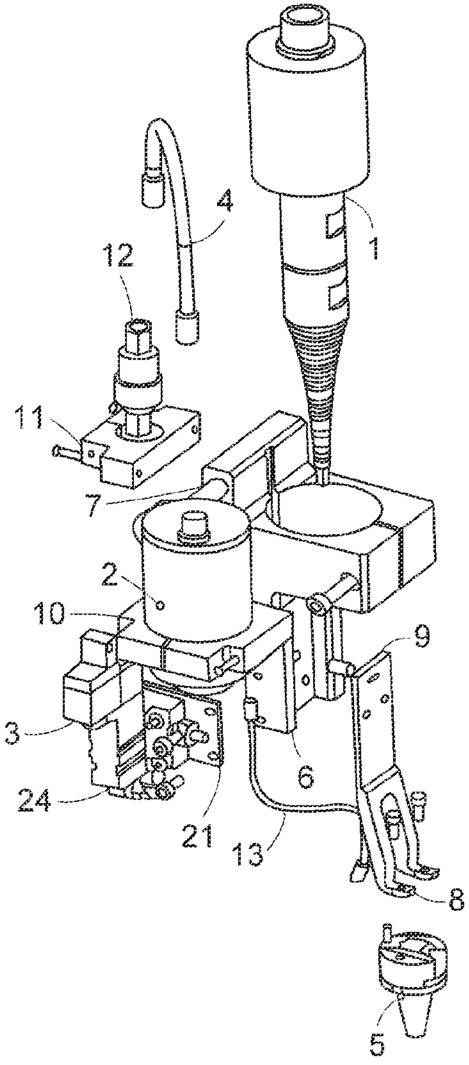
FIG. 9 is an exploded view of the component parts showing the relationships between the ultrasonic spray head with ILDS and the pulsed liquid delivery system embodiment of the present invention.

Referring in detail to FIG. 9, the ultrasonic spray head with ILDS and pulsed liquid delivery system has thirteen components:

(Item-1) Ultrasonic transducer
(Item-2) Micro flow control valve
(Item-3) Air flow control valve
(Item-4) Liquid feed tube
(Item-5) Integrated fluids applicator
(Item-6) Spray head mounting bracket
(Item-7) Mounting thumb screw
(Item-8) Fluids applicator mounting bracket
(Item-9) Cam adjuster
(Item-10) Micro flow control bracket
(Item-11) Filter bracket
(Item-12) Fluid filter
(Item-13) Liquid spray tube The ILDS is fixed in position relative to the spray forming tip with a precision bracket system that allows the ILDS to be adjusted in the "Z" direction and the "X" direction. The mounting surface of the ILDS attaches to the fork shaped end of the ILDS bracket with two machine screws. The ILDS mounting holes in the bracket are slotted to allow the ILDS to be positioned in the "X" axis relative to the spray forming tip. The ILDS bracket attaches to the slots in the "tee" shaped leg of the spray head bracket with two machine screws and wave washers. The barrel of the adjuster cam mounts in a hole in the spray head bracket underneath the ILDS bracket. The slotted end of the adjuster cam protrudes from the backside of the tee leg to allow the cam to be rotated with a screwdriver. The eccentric pin portion of the adjuster cam mates with a slot in the ILDS bracket. When the cam adjuster is rotated the eccentric pin moves the ILDS bracket up and down to provide the "Z" adjustment of the ILDS relative to the spray forming tip.

The spray head is clamped in the spray head bracket. The spray head is "keyed" to the bracket to orient the spray forming tip to the ILDS.

Pulsed Liquid Delivery

A precision liquid delivery system controls liquid flow to the spray forming tip. The liquid delivery system consists of a high-speed miniature solenoid valve and a high-speed driver circuit. The valve is commercially available from The Lee Company, USA. The solenoid valve is chemically inert, has a response time of less than 0.25 milliseconds and operates at speeds up to 1200 Hz. The valve has an open flow capacity, with water, of 20 cc/min at 20-PSI pressure. See FIGS. 2, 3, and 4, discussed above.

Thin, precisely defined coating patterns are achievable using the ultrasonic spray system with the precision liquid delivery system.

Coating Segment Shape

Figure 10A:
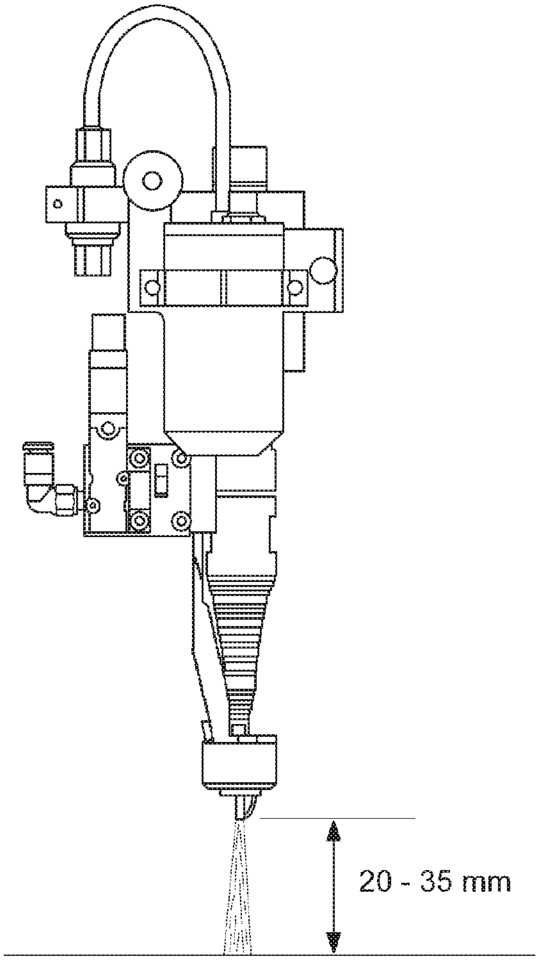
FIG. 10, which has two parts (10 and 10A), illustrates the operation of one spray head embodiment of the present invention and shows one example of a precise spray pattern obtained therefrom.
Figure 10B:
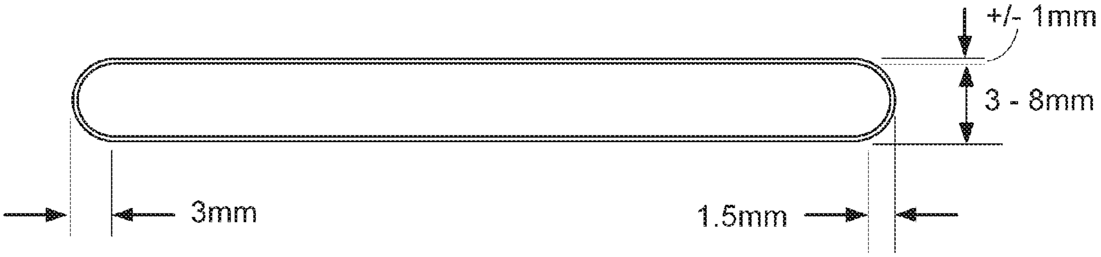

Referring in detail to FIG. 10, the ultrasonic spray head with ILDS and precision liquid delivery system produces a coating segment with a predetermined shape. The width of the coating segment is proportional to the 1) ID of the liquid feed tube in the ILDS; 2) the liquid flow rate; and 3) the speed of the spray head relative to the substrate. The coating segment width is directly proportional to the ID of the liquid feed tube the smaller the ID of the liquid feed tube, the narrower the coating segment width. The coating segment width is directly proportional to the liquid flow rate—the lower the flow rate, the narrower the coating segment width. The coating segment width is inversely proportional to the head speed—the faster the speed of the head, the narrower the coating segment width.

The precision liquid delivery system enables accurate control over the shape of a coating segment. Precisely metering the liquid flow to the spray forming tip provides a smooth transition from a flow "off" to a flow "on" condition and vice versa. The rapid on/off metering of the liquid flow eliminates heavy (wide) sections at the beginning and end of spray segments that would normally result if a conventional solenoid valve or pneumatically actuated needle valve were used. Additionally, the precision liquid delivery system allows the liquid flow rate to be changed electronically with the system control software. Thus, the coating thickness and coating segment width can be changed independent of coating head speed providing a more versatile, fully programmable selective coating system.

Figure 11:
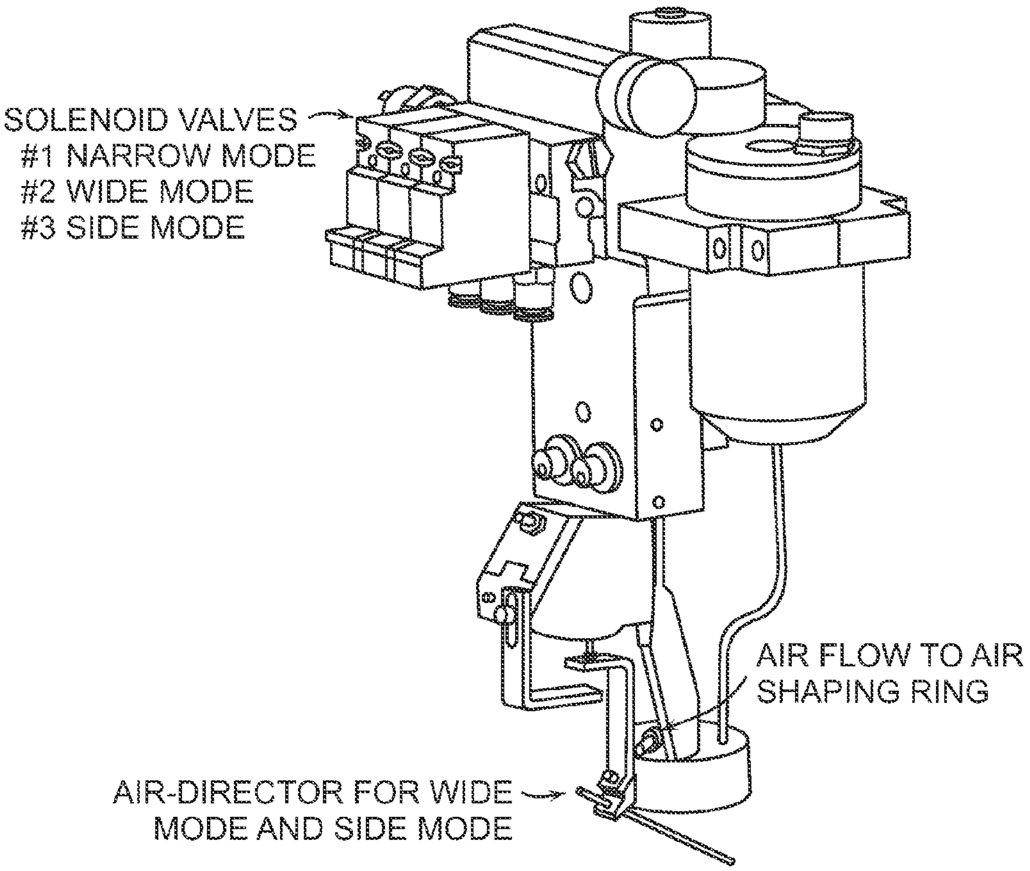
FIG. 11 illustrates one spray head embodiment of the present invention with an air director and an air-director positioner. As illustrated, three solenoid control valves (#1, #2 and #3) are mounted thereon, namely Narrow Mode (#1), Wide Mode (#2) and Side Mode (#3).
Figure 12:
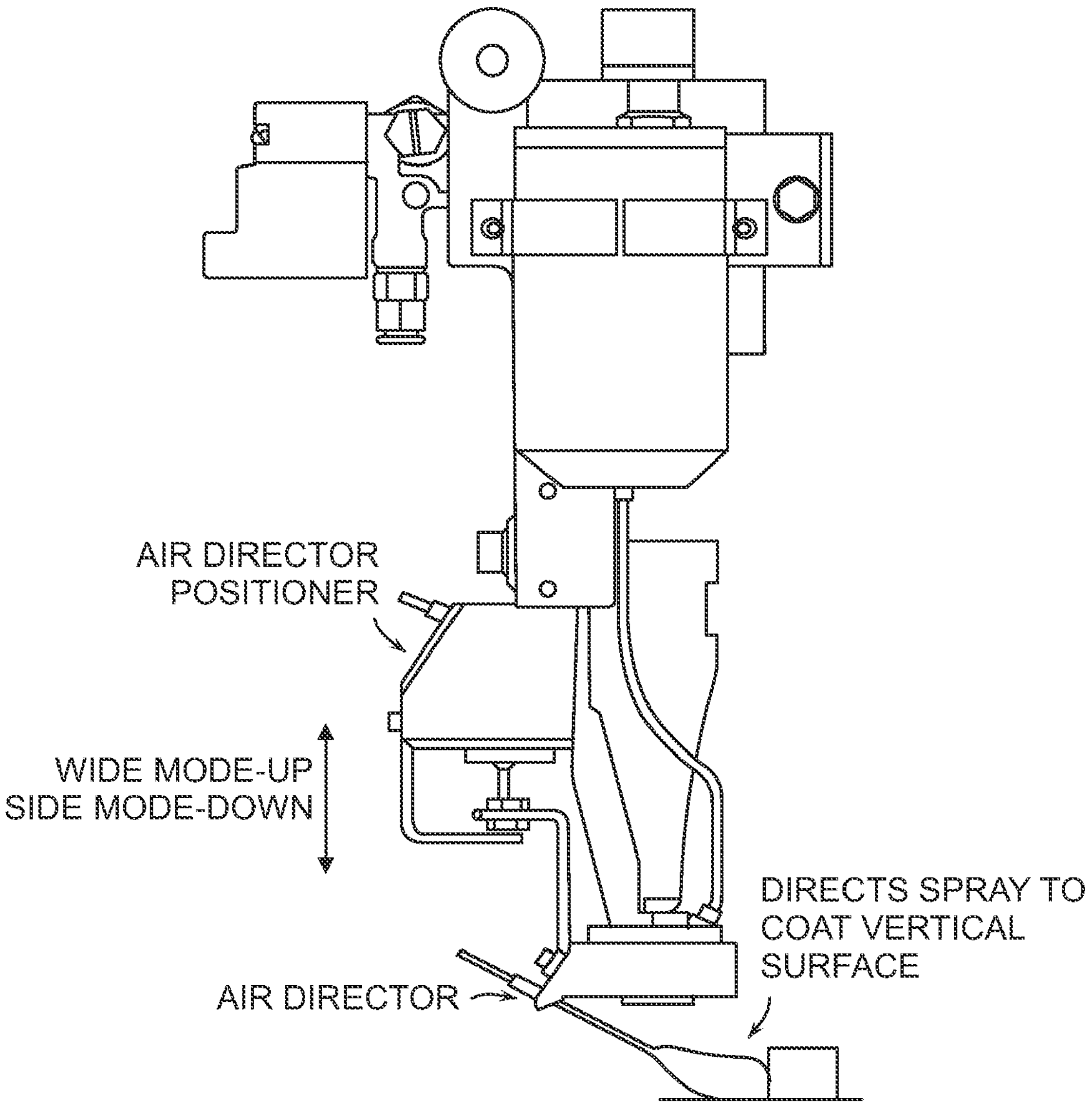
FIG. 12 illustrates one spray head embodiment of the present invention with the air director positioner used for wide mode (up) and side mode (down).
Figure 13:
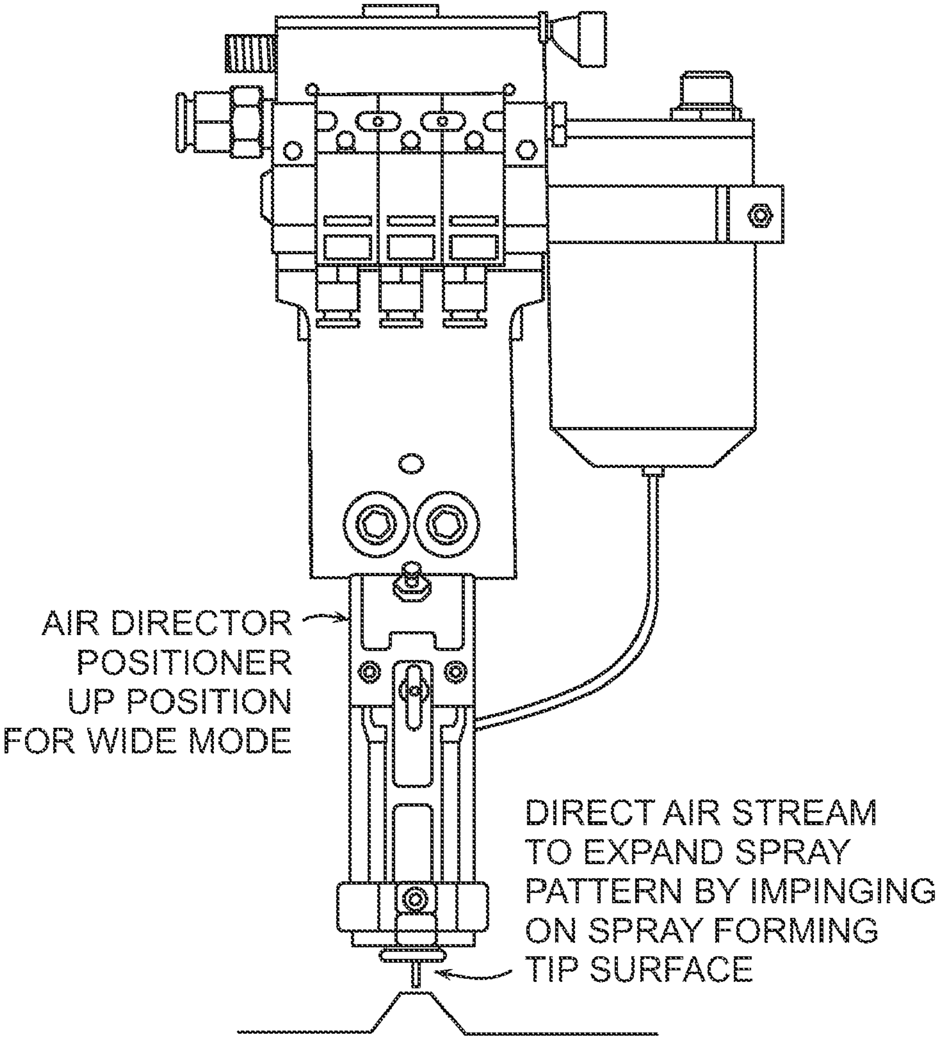
FIG. 13 illustrates one spray head embodiment of the present invention with the air director positioner used for wide mode spraying.

Referring in detail to FIGS. 11, 12 and 13, in addition to the directed air stream produced by the air-shaping ring described above, the following additional improvements in the spray head have been made:

1) An air director and mounting ring.
2) A pneumatically actuated air director positioner for the air director.
3) Two additional solenoid valves to activate air flow to the air director and to the air director positioner.

These improvements enable the spray head to operate in any one of the following three-modes (or combinations thereof):

1) Narrow mode—where the airflow is directed through the air ring to focus the ultrasonically produced spray (i.e., as described above).
2) Wide mode—where the airflow is directed through the air director to expand the ultrasonically produced spray. Impinging the directed air stream on the flat surface of the spray-forming tip expands the spray. The directed air stream is impinged on the opposite surface to the liquid feed surface. See, FIGS. 12 and 13.
3) Side mode—where the air director positioner is actuated, moving the air director to the lower position and airflow is directed through the air director to direct the ultrasonically produced spray at an oblique angle from the spray forming tip. The purpose of directing the spray at an oblique angle is to coat a vertical surface, such as the side of a tall component that would not otherwise be coated if the spray were directed in the normal vertical path. See, FIGS. 11 and 12.

Referring in detail to FIG. 11, the ultrasonic spray head with ILDS, precision liquid delivery system, air director positioner, air director and air director mounting ring produces a coating segment with a shape. When solenoid valve #1 is activated, airflow is directed to the air-shaping ring producing a narrow pattern as described previously. When solenoid valve #2 is activated, airflow is directed through the air director, which impinges the air stream on the flat surface of the spray-forming tip on the opposite side to the liquid feed tube. The impinged air stream expands the ultrasonically produced spray emanating from the spray-forming tip producing a wide pattern up to five times the width of the narrow mode pattern. When solenoid valve #3 is activated the air director positioner is actuated to move the air director to position in which the air stream through the air director (activated by solenoid #2) is directed directly into the ultrasonically produced spray emanating from the spray-forming tip. The resulting spray pattern from the simultaneous activation of solenoid valves #2 and #3, produces a sideways spray in which coating is applied to a vertical surface.

Referring in detail to FIG. 12, solenoid valves #2 and #3 are activated, moving the air director to direct the air stream into the ultrasonically produced spray. The spray is directed to the side (vertical) surface of a component.

Referring in detail to FIG. 13, solenoid valve #2 is activated, directing the airflow through the air director to impinge upon the side surface of the spray-forming tip. The impinged air expands the ultrasonically produced spray to a width up to five times the narrow mode width (FIG. 10).

The present invention has been described in detail, including the preferred embodiments thereof. However, it will be appreciated that those skilled in the art, upon consideration of the present disclosure, may make modifications and/or improvements on this invention and still be within the scope of this invention as set forth in the following claims.

What is claimed is:

1. An ultrasonic spray coating system comprising:

(a) an ultrasonic transducer with a spray forming head and an integrated liquid delivery device;

(b) a first large area coating applicator for coating large areas of a substrate, (c) a second small area coating applicator for coating small areas of the substrate, (d) a motion and positioning system for both coating applicators, and (e) a system controller;

wherein the integrated liquid delivery device further comprises an integrated fluid applicator; and wherein the integrated fluid applicator comprises a liquid output surface, an air output annulus and an air-shaping ring.

2. The coating system of claim 1, wherein the second coating applicator is used to apply coatings to pre-selected small areas of a substrate, as small as 1 $mm^2$, at the same coating thickness formed with the first coating applicator.

3. The coating system of claim 2, wherein the second coating applicator is used to apply low viscosity liquids of the same formulation applied by the first coating applicator.

4. The coating system of claim 2, wherein the second coating applicator produces a small coating segment in the form of a thin line or dot, with a coating segment width of about 1 mm.

5. The coating system of claim 2, wherein the second coating applicator uses a common liquid storage and delivery system with the first coating applicator.

6. The coating system of claim 2, wherein the second coating applicator is adapted to apply a coating accurately from a distance up to 20 mm above the substrate.

7. The coating system of claim 2, wherein the second coating applicator is adapted to allow adjustment of the coating flow rate electronically using a drive circuit for the dispensing head.

8. The coating system of claim 2, wherein the second coating applicator further comprises a multi-axis motion and positioning system (X-Y-Z-θ-Ø) to control the velocity and position of the micro-line dispensing head for the application of coating to selected areas on the substrate.

9. The coating system of claim 1, wherein the integrated liquid delivery device further comprises air and liquid passageways.

10. The ultrasonic spray coating system of claim 1, wherein the integrated liquid delivery device further comprises an integrated fluid applicator.

11. The ultrasonic spray coating system of claim 10, wherein the integrated fluid applicator comprises separate passageways for liquid and air.

12. The ultrasonic spray coating system of claim 1, wherein the system is capable of spraying liquids onto substrates in a pattern about 1⁄16 inch to about 3⁄16 inch wide, at a distance of up to 1.75 inches from the substrate.

13. The ultrasonic spray coating system of claim 1 wherein the ultrasonic transducer further comprises an ultrasonic converter that converts high frequency electrical energy into high frequency mechanical energy.

14. The ultrasonic spray coating system of claim 13, wherein the converter has a predetermined resonant frequency.

15. The ultrasonic spray coating system of claim 14, wherein the spray forming head is coupled to the converter and is resonant at the same resonant frequency of the converter.

16. The ultrasonic spray coating system of claim 1, wherein the spray forming head has a spray-forming tip and concentrates the vibrations of the converter at the spray-forming tip.

17. The ultrasonic spray coating system of claim 1, wherein the integrated fluid applicator further comprises separate ports for air and liquid.

18. The ultrasonic spray coating system of claim 17, wherein the air inlet port is connected to a ring shaped annulus.

19. The ultrasonic spray coating system of claim 17, wherein the inlet port for liquid is connected to the output surface of the applicator.

20. The ultrasonic spray coating system of claim 1, wherein the air-shaping ring is attached to the bottom of the fluid applicator to enclose the air annulus to form an air passageway to supply air to the holes in the air-shaping ring.

21. The ultrasonic spray coating system of claim 20, wherein the angle of the holes in the air-shaping ring can be set to achieve a specific focal point of the liquid spray, thus producing the desired spray pattern size.

22. The ultrasonic spray coating system of claim 1, further comprising an air director and mounting ring.

23. The ultrasonic spray coating system of claim 1, further comprising a pneumatically actuated air director positioner for the air director.

24. The ultrasonic spray coating system of claim 1, further comprising additional solenoid valves to activate air flow to the air director and to the air director positioner.

25. The ultrasonic spray coating system of claim 1, adapted for operation in one or more of the following spray modes; (a) narrow mode; (b) wide mode; and/or (c) side mode.

26. An ultrasonic spray coating system comprising an ultrasonic transducer with spray forming head, integrated liquid delivery device with air and liquid passageways, support brackets and an ultrasonic power generator, wherein:

the integrated liquid delivery device further comprises an integrated fluid applicator; and the ultrasonic transducer further comprises an ultrasonic converter that converts high frequency electrical energy into high frequency mechanical energy; and the spray forming head further comprises a spray-forming tip and concentrates the vibrations of the converter at the spray-forming tip; and the integrated fluid applicator further comprises separate passageways for liquid and air; and the integrated fluid applicator further comprises a liquid output surface, an air output annulus and an air-shaping ring; and the integrated fluid applicator further comprises separate ports for air and liquid; and the air inlet port is connected to a ring shaped annulus; and the inlet port for liquid is connected to the output surface of the applicator; and the air-shaping ring attaches to the bottom of the fluid applicator to enclose the air annulus to form an air passageway to supply air to holes in the air-shaping ring; and the ultrasonic spray coating system further comprises an air director and mounting ring; and the ultrasonic spray coating system further comprises a pneumatically actuated air director positioner for the air director; and the ultrasonic spray coating system further comprises two additional solenoid valves to activate air flow to the air director and to the air director positioner.

27. The ultrasonic spray coating system of claim 26, adapted for operation in one or more of the following spray modes; (a) narrow mode; (b) wide mode; and/or (c) side mode.

* * * * *